United States Patent [19]
Pankove et al.

[11] Patent Number: 4,584,028
[45] Date of Patent: Apr. 22, 1986

[54] NEUTRALIZATION OF ACCEPTOR LEVELS IN SILICON BY ATOMIC HYDROGEN

[75] Inventors: Jacques I. Pankove, Princeton, N.J.; David E. Carlson, Yardley, Pa.

[73] Assignee: RCA Corporation, Princeton, N.J.

[21] Appl. No.: 653,559

[22] Filed: Sep. 24, 1984

[51] Int. Cl.$^4$ .......................................... H09L 21/265
[52] U.S. Cl. ................................... 148/1.5; 29/576 B; 29/576 T; 148/187; 148/DIG. 128; 427/36; 427/38; 427/39
[58] Field of Search ............... 148/1.5, 187; 29/576 B, 29/576 T; 427/36, 38, 39

[56] References Cited

U.S. PATENT DOCUMENTS

| 4,224,084 | 9/1980 | Pankove | 148/1.5 |
| 4,322,253 | 3/1982 | Pankove et al. | 148/1.5 |
| 4,331,486 | 5/1982 | Chenevas-Paule et al. | 148/1.5 |
| 4,339,285 | 7/1982 | Pankove | 148/1.5 |
| 4,364,779 | 12/1982 | Kamgar et al. | 148/1.5 |
| 4,447,272 | 5/1984 | Saks | 148/1.5 |

OTHER PUBLICATIONS

Magarino et al, Phil. Mag. 45B (1982) 285-306.
Balk et al, IBM-TDB, 10 (1968) 1277.
Ohmura et al, Phys. Stat. Solidi 15a (1973) 93.
Pankove et al., (II) Physical Review Letters, vol. 51, No. 24, pp. 2224 & 2225, Dec. 12, 1983.
Pankove et al. (III), Applied Physics Letters, vol. 35, No. 12, Dec. 15, 1980.
Dubte,acu/e/ et al., Applied Physics Letters, vol. 44, No. 4, pp. 425-427, Feb. 15, 1984.
Tarng et al., IEEE Transactions on Electron Devices, vol. ED-26, Nov. 11, 1979, pp. 1728-1734.
Pankove et al. (IV), Applied Physics Letters, vol. 34, No. 2, Jan. 15, 1979.
Hansen et al., Applied Physics Letters, vol. 44, pp. 606-608, Mar. 15, 1984.

*Primary Examiner*—Upendra Roy
*Attorney, Agent, or Firm*—B. E. Morris; R. H. Swope

[57] ABSTRACT

A p-type impurity in a silicon semiconductor structure is at least partially neutralized by exposure to atomic hydrogen. The subject method provides an excellent means of modifying the profile of the impurity. Suitable impurities include boron, aluminum, gallium and indium.

10 Claims, No Drawings

NEUTRALIZATION OF ACCEPTOR LEVELS IN SILICON BY ATOMIC HYDROGEN

This invention relates to the treatment of an acceptor impurity in silicon to partially neutralize it.

BACKGROUND OF THE INVENTION

Doping a silicon semiconductor with an acceptor or p-type impurity is widely used in the electronics industry to render silicon p-type conducting. Examples of suitable acceptor impurities include boron, aluminum, indium and gallium, with boron being the most common. The impurity can be uniformly distributed in the silicon or concentrated, e.g., in an implant at the surface.

The trend in the electronics industry is toward increasing complexity of integrated circuits and decreasing device dimensions. This requires more rigid tolerances and lower defect densities. With regard to impurities in a silicon substrate, it is required that they be as uniform as possible and have well defined profiles.

The subject method provides a means of modifying the electrical properties of a silicon semiconductor to improve the uniformity or the profile of an acceptor impurity therein. There is also provided a method of creating a well-defined buffer zone in an uniformly-doped silicon structure by neutralizing the surface thereof.

BRIEF SUMMARY OF THE INVENTION

An acceptor implant in a silicon semiconductor is at least partially neutralized by the absorption of atomic hydrogen at relatively low temperatures, i.e. between 70° and 130° C. The absorbed hydrogen can be released to a predetermined degree by heating the substrate above about 200° C.

DETAILED DESCRIPTION OF THE INVENTION

This invention pertains to the partial neutralizing of an acceptor impurity in a silicon semiconductor such as, for example, a conventional silicon wafer or a silicon layer which is part of a multilayer structure. The silicon structure can contain the impurity uniformly dispersed throughout as occurs when a layer of silicon is doped as it is grown. The silicon structure may also contain the impurity at the surface as might occur in diffusion or ion implantation.

The acceptor impurity can be introduced into the silicon semiconductor by any conventional technique such as, for example, doping by diffusion from a gas, e.g. boron trichloride, or a solid source of impurity which is coated onto the silicon, e.g. borosilicate glass. Such techniques are well within the purview of one of ordinary skill in the art. Regardless of how the impurity is introduced into the silicon structure, it must be treated to render it substitutional, and therefore electrically active. The silicon is generally heated to high temperatures, i.e. at least about 900° C., to cause the impurity to be in substitutional sites in the silicon lattice. The heating step is also necessary to anneal damage, if any, caused by the doping procedure, e.g. ion implantation. The present method is applicable to silicon semiconductors having acceptor impurities at substitutional sites.

It is known that the surface of a silicon semiconductor can be passivated by first amorphizing followed by exposure to atomic hydrogen, e.g. in a glow discharge. This technique neutralizes silicon dangling bonds on the surface, thereby raising the resistivity of the affected region and passivating the device. The resultant device has graded crystallinity and a large concentration of hydrogen at the surface. While it is known that there are dangling bonds in silicon that can be neutralized, it is considered unexpected that dangling bonds still exist in silicon which has an acceptor impurity implanted and at substitutional sites therein. The subject method thus represents a significant step beyond doping of a silicon structure with an acceptor ion which conventionally ends with heating to render the impurity substitutional.

The acceptor impurity utilized to dope the silicon structure in accordance with this invention is selected from the group consisting of boron, aluminum, gallium and indium. These impurities may be introduced into the silicon by any conventional technique. Generally, when a silicon structure is doped as deposited, e.g. by chemical vapor deposition, the structure will contain from about $10^{14}$ to about $10^{20}$ ions per cubic centimeter of the impurity. When the structure is selectively doped by ion implantation of an impurity, the dosage is typically from about $10^{10}$ to about $10^{16}$ ions per square centimeter. When the silicon structure is doped by diffusion techniques, a surface concentration of from about $10^{14}$ to about $10^{20}$ ions per cubic centimeter is contemplated. One skilled in the art will appreciate that these impurity concentrations will vary with the particular impurity, as well as the intended use of the device being produced.

The doped silicon structure is heated to a temperature sufficient to cause the implant to become substitutional. Generally, this requires a temperature of at least about 900° C. and preferably between about 1000° and 1200° C., suitably in an inert ambient such as nitrogen. The structure may be heated in a furnace over a period of about 30 minutes or in a rapid heating means, such as a high-intensity visible light heating means, for 30 seconds or less. It is preferred to utilize a heating means which heats the entire structure as opposed to heating means, such as a laser, which heats only the surface since less internal strain is created when the entire structure is heated.

In accordance with this invention, the doped, electrically active silicon structure is exposed to atomic hydrogen which is absorbed into the silicon thereby partially neutralizing the acceptor impurity. The atomic hydrogen is suitably produced by an rf discharge in conventional equipment. The subject exposure to atomic hydrogen is suitably carried out at between about 70° and 150° C., preferably about 110° C., and from about 0.05 to 5.0, preferably 0.2, torr of hydrogen.

Doped silicon structures are suitably exposed to atomic hydrogen in accordance with the subject method for about one hour. It will be appreciated that the duration of the treatment is dependent on the desired profile of the impurity. The depth of penetration of the absorbed hydrogen into the silicon structure is generally dependent on the concentration of the impurity, the duration of treatment, the temperature and the pressure, and lesser influences such as the particular impurity present. For example, we have found that the penetration depth of atomic hydrogen markedly increases as the concentration of a boron implant in the structure decreases, other conditions remaining constant. This would indicate that the hydrogen penetrates the silicon by diffusion which is impeded by the presence of the impurity at the substitutional sites. The duration of the hydrogen treatment of this invention also determines the percentage of impurity neutralized at any given depth.

The method of this invention can be utilized to create a variety of profiles in the silicon structure. For example, an uniformly-doped structure can be treated in accordance with this invention to create a neutral zone at the surface. This would be advantageous, for example, for that portion of a silicon substrate underlying a gate because increasing the resistivity of the underlying substrate would lower the threshold of the gate, thus making it more sensitive.

In the instance of an implanted substrate, the method of this invention can achieve a number of results. First, by partially neutralizing the implant at the surface, which is the area of highest concentration, the implant can be made more uniform. Second, the peak of the implant can be moved inwardly, thus achieving a distinctly different implant profile. In the instance of a n-type substrate with a p-type implant, neutralizing the implant in an area or "layer" at the surface by the subject method will create an n-p-n sandwich. Such n-p-n structures are useful, for example, in photosensitive detectors such as "electric eye" devices.

The process of this invention is reversible by heating the substrate to a temperature in excess of 200° C. to drive off the hydrogen. This enables one to produce a more conductive region by removing some of the hydrogen atoms at the area of highest implant concentration. This property permits a tailoring of the conductivity profile not heretofore achievable. At the same time, however, the labile characteristic of the hydrogen bond at the substitutional site precludes the use of temperatures substantially in excess of about 120° C. in further processing of the structure. Devices prepared by the subject method are stable at operating temperatures only up to about 100° C. This does not present a problem, however, for devices utilized at ambient temperatures well below the critical level, such as "electric eye" sensors.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

Single crystal silicon wafers of p-type and <100> orientation were coated with a 1.0 micrometer thick layer of photoresist which was conventionally patterned to expose predetermined areas of the wafer surface. Utilizing a commercial ion accelerator, a series of such wafers was ion implanted with boron ions at a dosage ranging from $4 \times 10^{14}$ to $7 \times 10^{15}$ ions per square centimeter. The wafers were heated to 1150° for one hour under nitrogen to render the implant substitutional and, therefore, electrically active.

A resistance profile was determined for the samples utilizing a Solid State Measurment Inc. ASR100 automatic spreading resistant probe on an angle lapped surface. The resistivity was obtained from a calibration against samples of known resistivity.

The wafers were exposed to atomic hydrogen which was produced by rf discharge in a low pressure hydrogen ambient in a conventional apparatus. The wafers were not subjected directly to the plasma, but were placed in a vessel in communication therewith and were heated to 122°. The wafers were treated with atomic hydrogen for one hour.

It was observed that the treatment increased the resistivity of the implant near the surface by a factor of as high as one hundred. It was further noted that the penetration of the absorbed hydrogen decreased as the concentration of boron in the implant increased.

The substrate wafers were again exposed to atomic hydrogen for an additional three hours. Resistance measurements made periodically during this time showed that the depth of penetration as well as the resistivity at the surface increased. The resistivity at the surface was more than two orders of magnitude higher than that in the bulk of the wafer. This indicates that substantially all of the impurity near the surface had been neutralized by the absorbed hydrogen.

All samples of wafers at each concentration of impurity were placed in a furnace and heated at 500° under vacuum for one hour. The bulk resistivity of the samples in each instance returned to about the original value.

A repetition of the process utilizing the same samples and recording about the same values demonstrated the reproducibility of the subject method.

We claim:

1. A method of modifying the electrical properties of a crystalline silicon semiconductor structure containing a p-type impurity wherein the impurity is substitutional and at least at the surface of the structure, the method comprising exposing the surface of the structure to atomic hydrogen at a temperature of from about 70° to 170° C. for a time sufficient to at least partially neutralize said impurity.

2. A method in accordance with claim 1, wherein the impurity is selected from the group consisting of boron, aluminum, indium and gallium.

3. A method in accordance with claim 1, wherein the structure comprises a layer of silicon uniformly doped with the impurity.

4. A method in accordance with claim 1, wherein said impurity is ion implanted into the structure and the structure is heated to a temperature sufficient to render the implant substitutional.

5. A method in accordance with claim 1, wherein the structure is exposed to atomic hydrogen at about 110° C. for one hour.

6. A method in accordance with claim 2, wherein the impurity is boron.

7. A method in accordance with claim 4, wherein the structure is heated to at least about 900° C.

8. A method of producing adjacent n-type, p-type and n-type regions in a crystalline silicon semiconductor substrate comprising:
   (a) implanting a n-type silicon structure with a p-type impurity thereby creating a p-type region at the surface thereof;
   (b) heating the structure to a temperature sufficient to render the implant substitutional; and
   (c) exposing the surface of the structure to atomic hydrogen at a temperature of from about 70° to 170° C. for a time sufficient to at least partially neutralize the implant thereby creating an p-type region at the surface.

9. A method in accordance with claim 8, wherein said impurity is selected form the group consisting of boron, aluminum gallium and indium.

10. A method in accordance with claim 9, wherein the impurity is boron.

* * * * *